(12) United States Patent
Huang et al.

(10) Patent No.: US 11,742,039 B2
(45) Date of Patent: Aug. 29, 2023

(54) SMALL-AREA SIDE-CAPACITOR READ-ONLY MEMORY DEVICE, MEMORY ARRAY AND METHOD FOR OPERATING THE SAME

(71) Applicant: YIELD MICROELECTRONICS CORP., Chu-Pei (TW)

(72) Inventors: Yu Ting Huang, Chu-Pei (TW); Chi Pei Wu, Chu-Pei (TW)

(73) Assignee: Yield Microelectronics Corp., Chu-Pei (TW)

( * ) Notice: Subject to any disclaimer, the term of this patent is extended or adjusted under 35 U.S.C. 154(b) by 40 days.

(21) Appl. No.: 17/698,175

(22) Filed: Mar. 18, 2022

(65) Prior Publication Data

US 2023/0230646 A1 Jul. 20, 2023

(30) Foreign Application Priority Data

Jan. 14, 2022 (TW) .................................. 111101586

(51) Int. Cl.
| | | |
|---|---|---|
| G11C 17/00 | (2006.01) | |
| G11C 17/04 | (2006.01) | |
| G11C 17/08 | (2006.01) | |
| H01L 49/02 | (2006.01) | |
| H10B 20/00 | (2023.01) | |

(52) U.S. Cl.
CPC .............. *G11C 17/04* (2013.01); *G11C 17/08* (2013.01); *H01L 28/40* (2013.01); *H10B 20/30* (2023.02)

(58) Field of Classification Search
None
See application file for complete search history.

(56) References Cited

U.S. PATENT DOCUMENTS

2008/0019165 A1* 1/2008 Lin .................. H01L 29/94
257/E29.345
2017/0053930 A1* 2/2017 Prinz ..................... H01L 28/00

* cited by examiner

*Primary Examiner* — Tan T. Nguyen
(74) *Attorney, Agent, or Firm* — Rosenberg, Klein & Lee

(57) ABSTRACT

A small-area side-capacitor read-only memory device, a memory array and a method for operating the same are provided. The small-area side-capacitor read-only memory device embeds a field-effect transistor in a semiconductor substrate. The field-effect transistor includes a first dielectric layer and a first conductive gate stacked on the first dielectric layer. The side of the first conductive gate extends to the top of the second dielectric layer and connects to the second conductive gate to generate a capacitance effect. The second conductive gate has finger portions connected to a strip portion. Thus, the memory device employs the smallest layout area to generate the highest capacitance value, thereby decreasing the overall area of the read-only memory and performing efficient reading and writing.

20 Claims, 7 Drawing Sheets

SMALL-AREA SIDE-CAPACITOR READ-ONLY MEMORY DEVICE, MEMORY ARRAY AND METHOD FOR OPERATING THE SAME

This application claims priority of Application No. 111101586 filed in Taiwan on 14 Jan. 2022 under 35 U.S.C. § 119; the entire contents of all of which are hereby incorporated by reference.

BACKGROUND OF THE INVENTION

Field of the Invention

The present invention relates to a memory array, particularly to a small-area side-capacitor read-only memory device, a memory array and a method for operating the same.

Description of the Related Art

Presently, in the semiconductor industry, Complementary Metal Oxide Semiconductor (CMOS) manufacturing process has become an ordinary manufacturing method for Application Specific Integrated Circuit (ASIC). With the rapid progress and development of the computer and information industries, Flash memory and electrically-erasable-programmable read-only memory (EEPROM) have been widely utilized in various electronic products for its non-volatile memory capability of being electrically programmable and erasable, such that data stored therein will not be lost, even when its power supply is turned off.

In general, a non-volatile memory is programmable, and the memory stores charges in order to change the gate voltage of a transistor in the memory, or the memory will not store charges, such that the gate voltage remains unchanged as the original gate voltage of the transistor in the memory. For an erasure operation, the charges stored in the non-volatile memory are removed, such that the gate voltage of the transistor in the memory will return to its original value. Refer to FIGS. 1 & 2 for a circuit diagram of a conventional non-volatile memory, and a circuit diagram of a conventional non-volatile memory layout respectively. As shown in FIGS. 1 & 2, the non-volatile memory is composed of a plurality of memory cells. Wherein, each memory cell includes a transistor 10 and a capacitor 12, between two adjacent byte-memory cells is provided with two bit lines, such that the area occupied is increased. Moreover, refer to FIG. 3 for a cross section view of a memory cell of a conventional non-volatile memory, as shown in FIG. 3, the capacitor 12 is located at one side of the transistor 10, since this kind of structure occupies large area, it will further raise the cost.

To overcome the abovementioned problems, the present invention provides a small-area side-capacitor read-only memory device, a memory array and a low-current low-voltage method for operating the same, so as to program a large number of memory cells simultaneously.

SUMMARY OF THE INVENTION

The primary objective of the present invention provides a small-area side-capacitor read-only memory device, a memory array and a method for operating the same, which employ areas where conductive gates overlap dielectric layers to produce a capacitance effect, wherein the conductive gate has finger portions to reduce the area of a circuit layout and achieve the highest capacitance value, thereby decreasing the overall area of the read-only memory and performing efficient reading and writing.

Another objective of the present invention provides a small-area side-capacitor read-only memory device, a memory array and a method for operating the same, which employ a small-area read-only memory to perform writing and erasing operations on a large number of memory cells at specific bias voltages.

In order to achieve the foregoing purposes, the present invention provides a small-area side-capacitor read-only memory device, which includes a semiconductor substrate, a field-effect transistor, and a capacitor. The field-effect transistor, formed in the semiconductor substrate, includes a first dielectric layer, a first conductive gate, and first ion-doped areas. The first dielectric layer is formed on the surface of the semiconductor substrate. The first conductive gate is stacked on the first dielectric layer. The first ion-doped areas are formed in the semiconductor substrate under regions that are arranged at two sides of the first conductive gate. The first ion-doped areas are respectively used as a source and a drain. The capacitor, formed in the semiconductor substrate, includes a second dielectric layer, a second conductive gate, and a second ion-doped area. The second dielectric layer is formed on the surface of the semiconductor substrate. The second conductive gate is connected to the first conductive gate and stacked on the second dielectric layer. The second ion-doped area and the first ion-doped areas are doped with ions that have the same conductivity type. The second ion-doped area is formed at a side of the second dielectric layer. The second conductive gate has a strip portion and parallel finger portions. One end of each of the finger portions, connected to the strip portion, extends outward from the strip portion.

The present invention also provides a small-area side-capacitor read-only memory array, which includes parallel bit lines, parallel word lines, parallel common source lines, and sub-memory arrays. The bit lines are classified into a plurality of groups. The plurality groups of the bit lines include a first group bit line and a second group bit line. The word lines, arranged perpendicular to the bit lines, include a first word line. The common source lines, arranged parallel to the word lines, include a first common source line. Each of the sub-memory arrays, connected to two groups of the bit lines, the word line, and the common source line, includes a first memory cell, a second memory cell, a third memory cell, and a fourth memory cell. The first memory cell is connected to the first group bit line, the first common source line, and the first word line. The second memory cell is connected to the second group bit line, the first common source line, and the first word line. The first memory cell and the second memory cell are arranged to be symmetric to each other and located at the same side of the first common source line. The third memory cell is connected to the first group bit line, the first common source line, and the first word line and arranged to be symmetric to the first memory cell with the first common source line as an axis. The fourth memory cell is connected to the second group bit line, the first common source line, and the first word line and arranged to be symmetric to the second memory cell with the first common source line as an axis. The third memory cell and the fourth memory cell are arranged to be to symmetric to each other and located at the same side of the first common source line. The first memory cell and the third memory cell are respectively located at two different sides of the first common source line. Each of the first memory cell, the second memory cell, the third memory cell, and the fourth memory cell includes the field-effect transistor and the capacitor that are formed in the semiconductor substrate.

The present invention provides a method for operating the small-area side-capacitor read-only memory array, wherein the field-effect transistor of each of the first memory cell, the second memory cell, the third memory cell, and the fourth memory cell is an N-type field-effect transistor. The first memory cell, the second memory cell, the third memory cell and the fourth memory cell all function as operation memory cells. In operating all the operation memory cells, a substrate voltage Vsub is applied to the semiconductor substrate, which is connected to all the operation memory cells, and a bit voltage Vb, a word voltage Vw and a common source voltage Vs are respectively applied to the bit lines, the word lines and the common source lines, which are connected to all the operation memory cells. In writing, the following conditions are satisfied: Vsub is grounded; Vs=Vb=0; and Vw=HV (High Voltage). In erasing, the following conditions are satisfied: Vsub is grounded; Vs=Vb=HV; and Vw is floating.

The present invention also provides a method for operating the small-area side-capacitor read-only memory array, wherein the field-effect transistor of each of the first memory cell, the second memory cell, the third memory cell, and the fourth memory cell is a P-type field-effect transistor. In operating all the operation memory cells, a substrate voltage Vsub is applied to the semiconductor substrate, which is connected to all the operation memory cells, and a bit voltage Vb, a word voltage Vw and a common source voltage Vs are respectively applied to the bit lines, the word lines and the common source lines, which are connected to all the operation memory cells. In writing, the following conditions are satisfied: Vsub=HV (High Voltage); Vs=Vb=HV; and Vw=0. In erasing, the following conditions are satisfied: Vsub=HV (High Voltage); Vs=Vb=0; and Vw is floating.

Below, the embodiments are described in detail in cooperation with the drawings to make easily understood the technical contents, characteristics and accomplishments of the present invention.

DETAILED DESCRIPTION OF THE INVENTION

Figure 1:
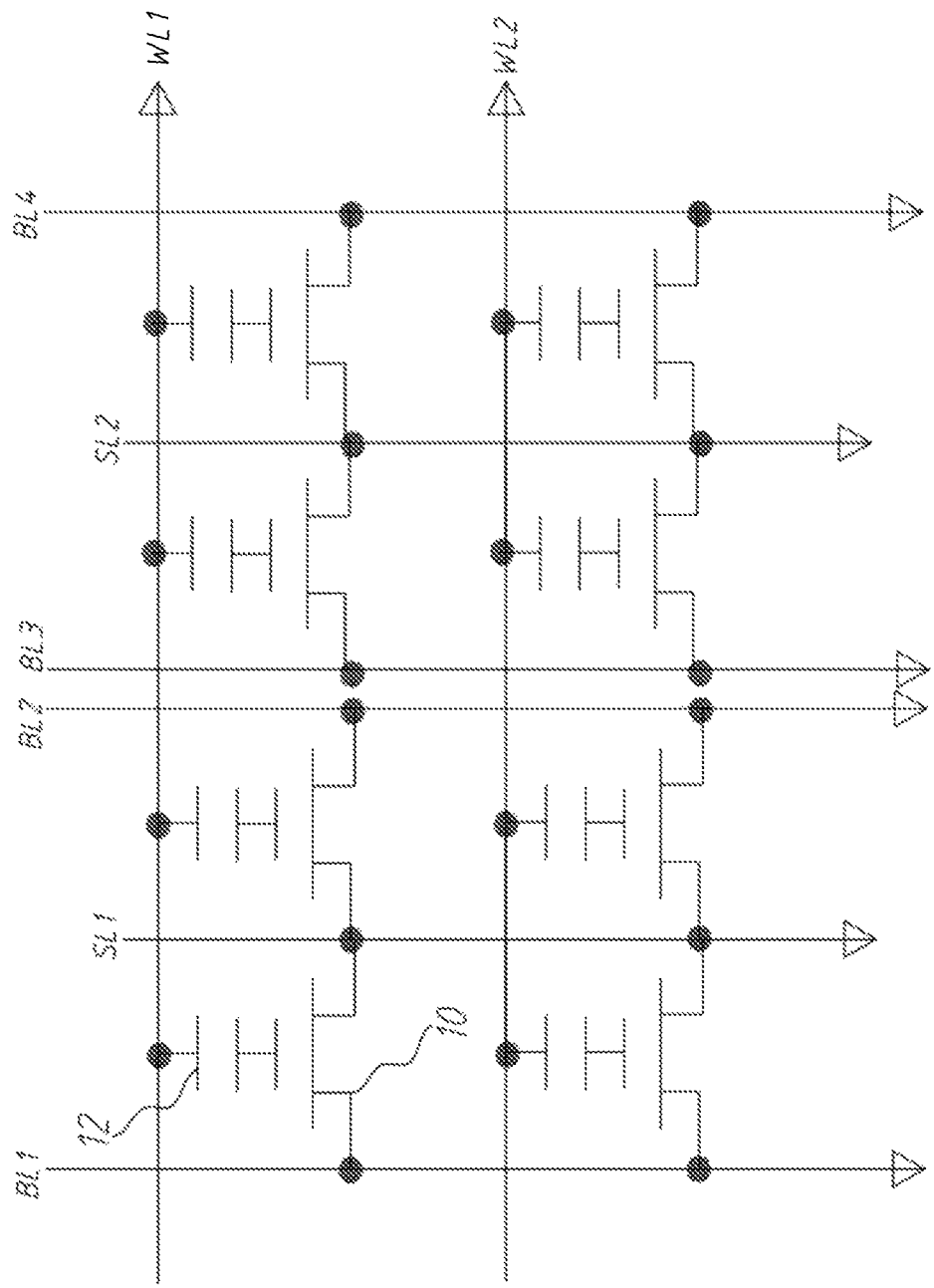
FIG. 1 is a schematic diagram illustrating a circuit of a conventional non-volatile memory.
Figure 2:
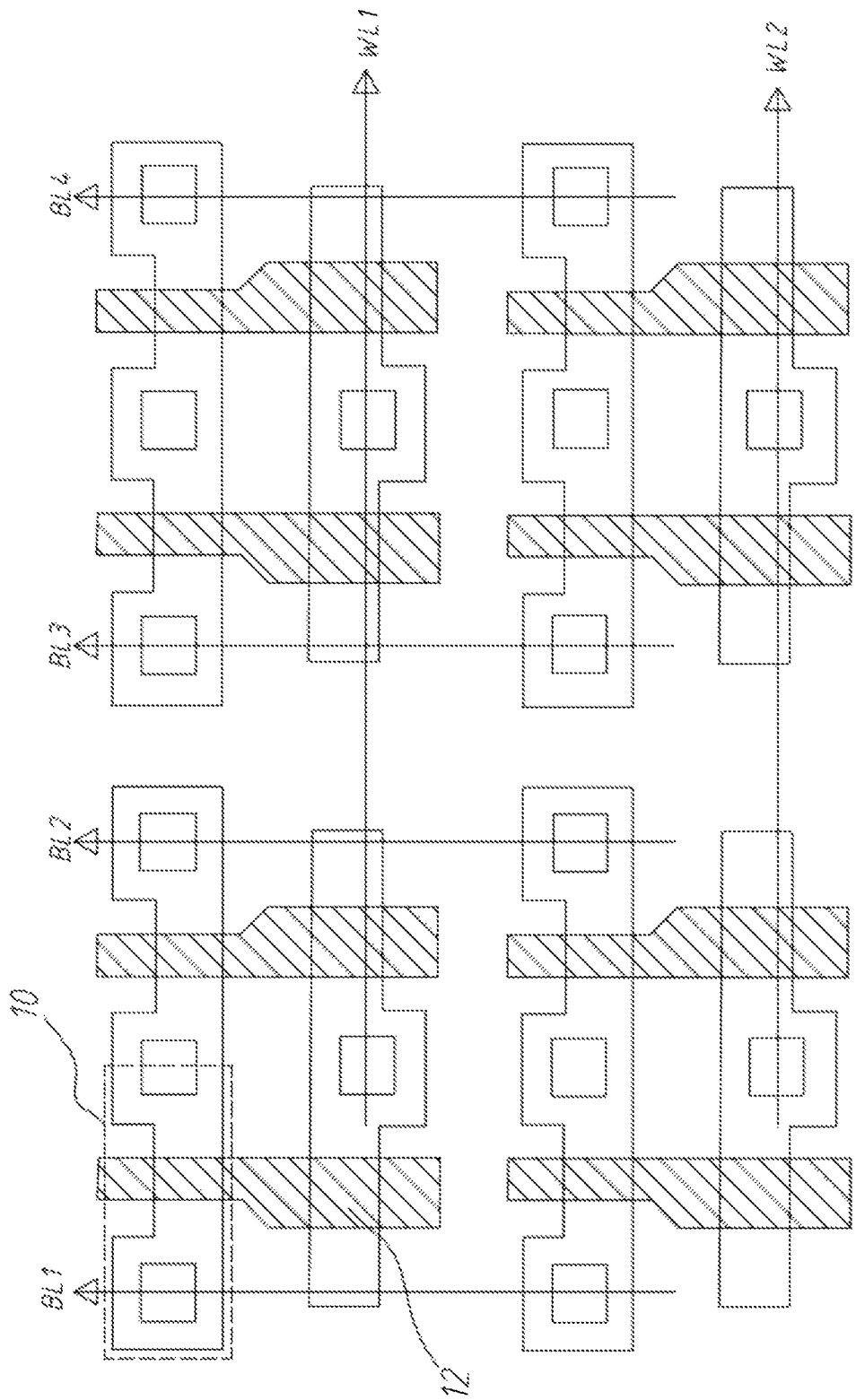
FIG. 2 is a schematic diagram illustrating a circuit layout of FIG. 1.
Figure 3:
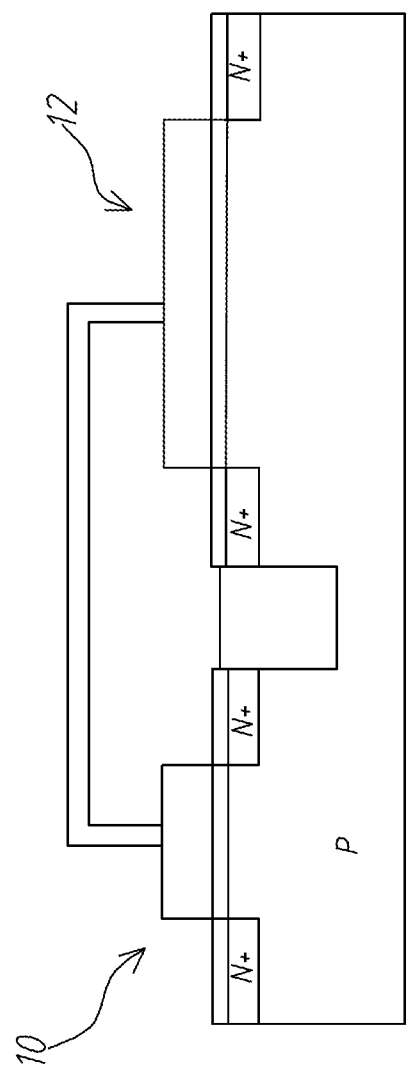
FIG. 3 is a cross-sectional view of a memory cell of a conventional non-volatile memory.
Figure 4:
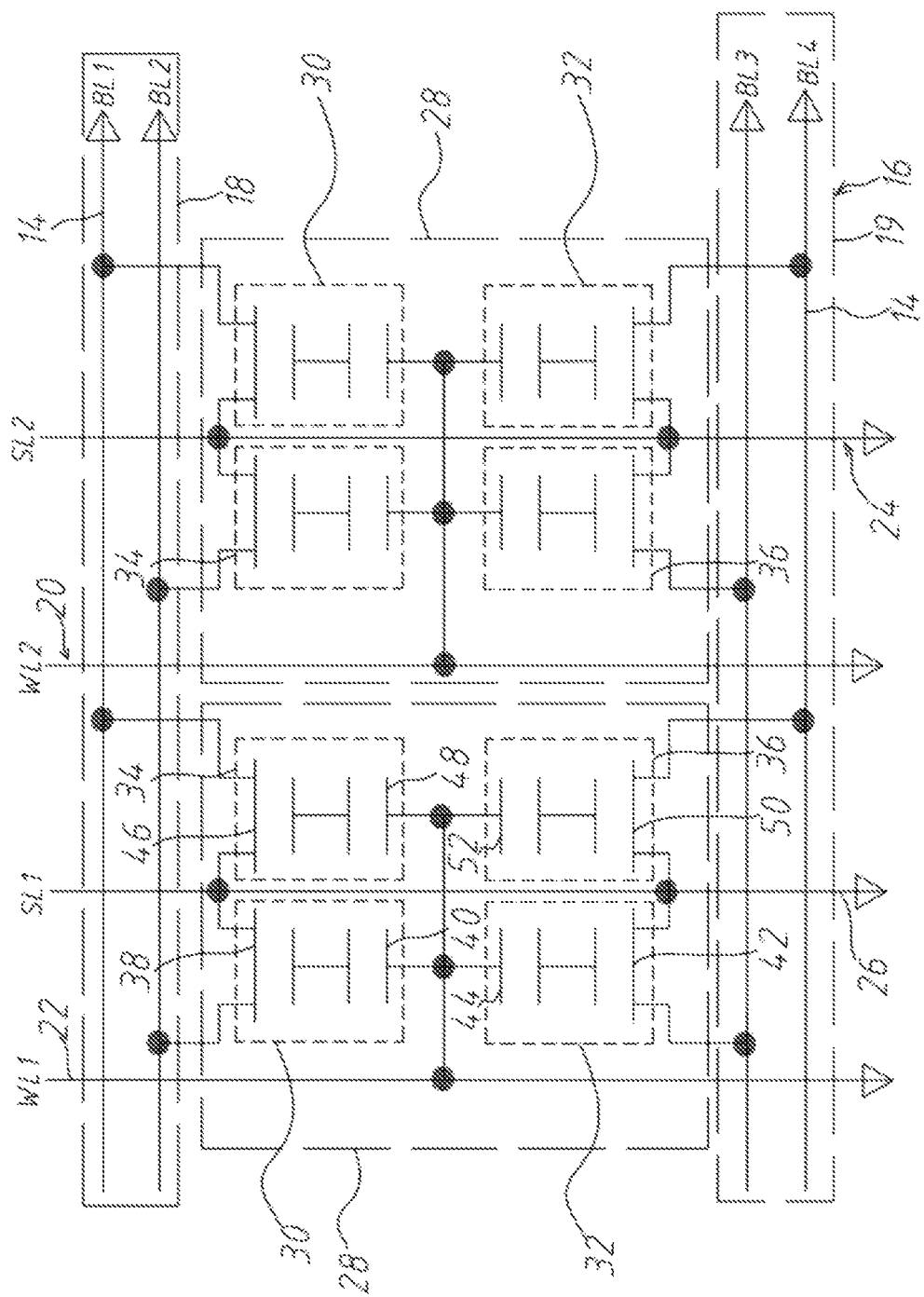
FIG. 4 is a schematic diagram illustrating a circuit of a small-area side-capacitor read-only memory array according to an embodiment of the present invention.
Figure 5:
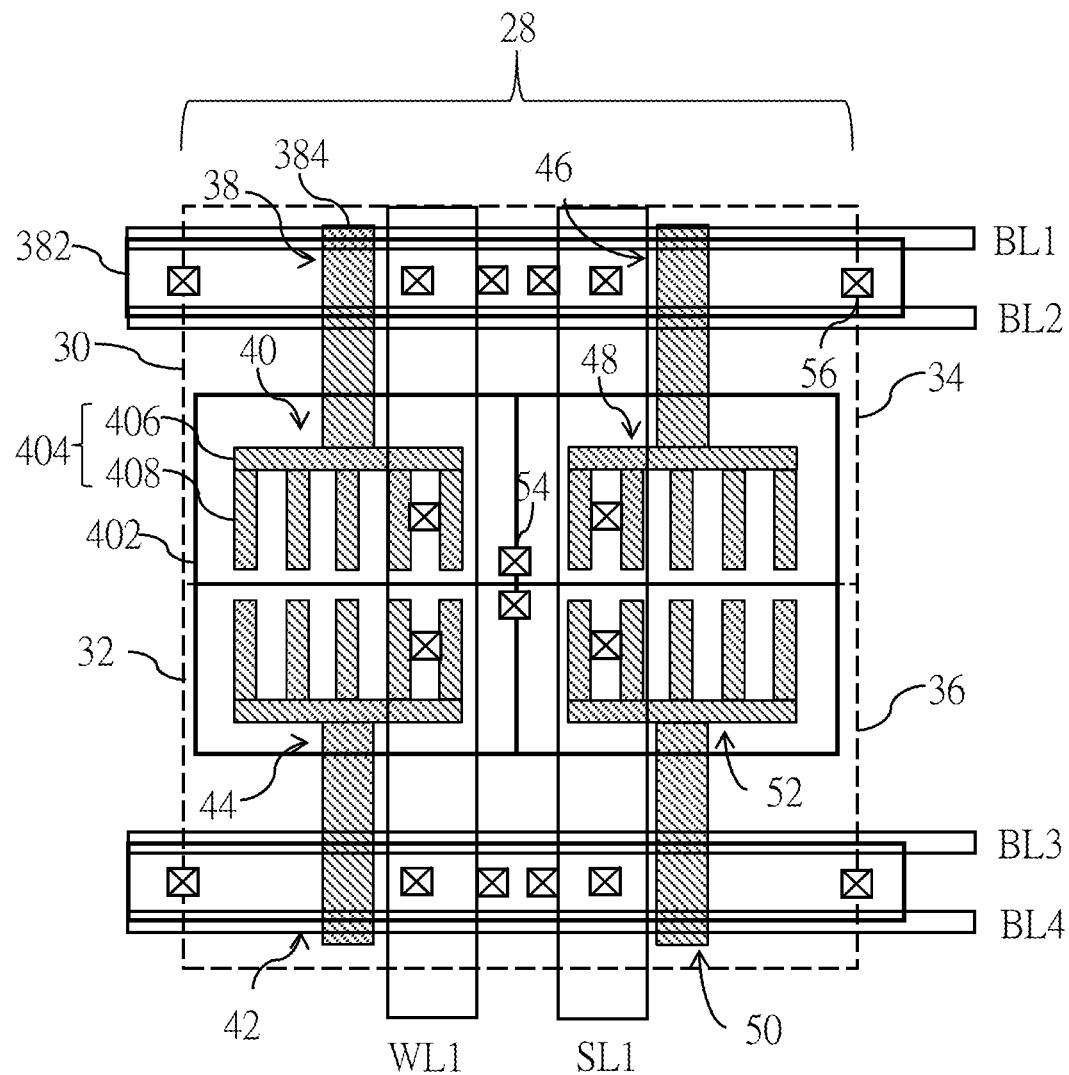
FIG. 5 is a schematic diagram illustrating a layout circuit of a sub-memory array according to an embodiment of the present invention.

Referring to FIG. 4 and FIG. 5, the present invention provides a small-area side-capacitor read-only memory array according to an embodiment, which includes parallel bit lines 14, parallel word lines 20, parallel common source lines 24, and sub-memory arrays 28. The bit lines 14, include a first bit line BL1, a second bit line BL2, a third bit line BL3, and a fourth bit line BL4, are classified into a plurality of groups 16. The plurality groups 16 of the bit lines 14 include a first group bit line 18 and a second group bit line 19. Each group 16 includes two bit lines 14. The first group bit line 18 includes two bit lines 14, namely the first bit line BL1 and the second bit line BL2. The second group bit line 19 includes two bit lines 14, namely the third bit line BL3 and the fourth bit line BL4. Besides, the word lines 20, arranged perpendicular to the bit lines 14, include two word lines 22, namely a first word line WL1 and a second word line WL2. The common source lines 24, arranged parallel to the word lines 20, include two common lines 26, namely a first common source line SL1 and a second common source line SL2. The word lines 14, the word lines 20, and the common source lines 24 are connected to sub-memory arrays 28 each being a 2×2 bit memory cell. Each of the sub-memory arrays 28 is connected to two groups of the bit lines 16, the two word lines 20, and the common source line 24 and located between two adjacent groups of the bit lines 16. Since the connections of each sub-memory array 28 to the bit lines 16, the two word lines 20, and the common source line 24 are similar, they are described in detail as follows.

Figure 6:
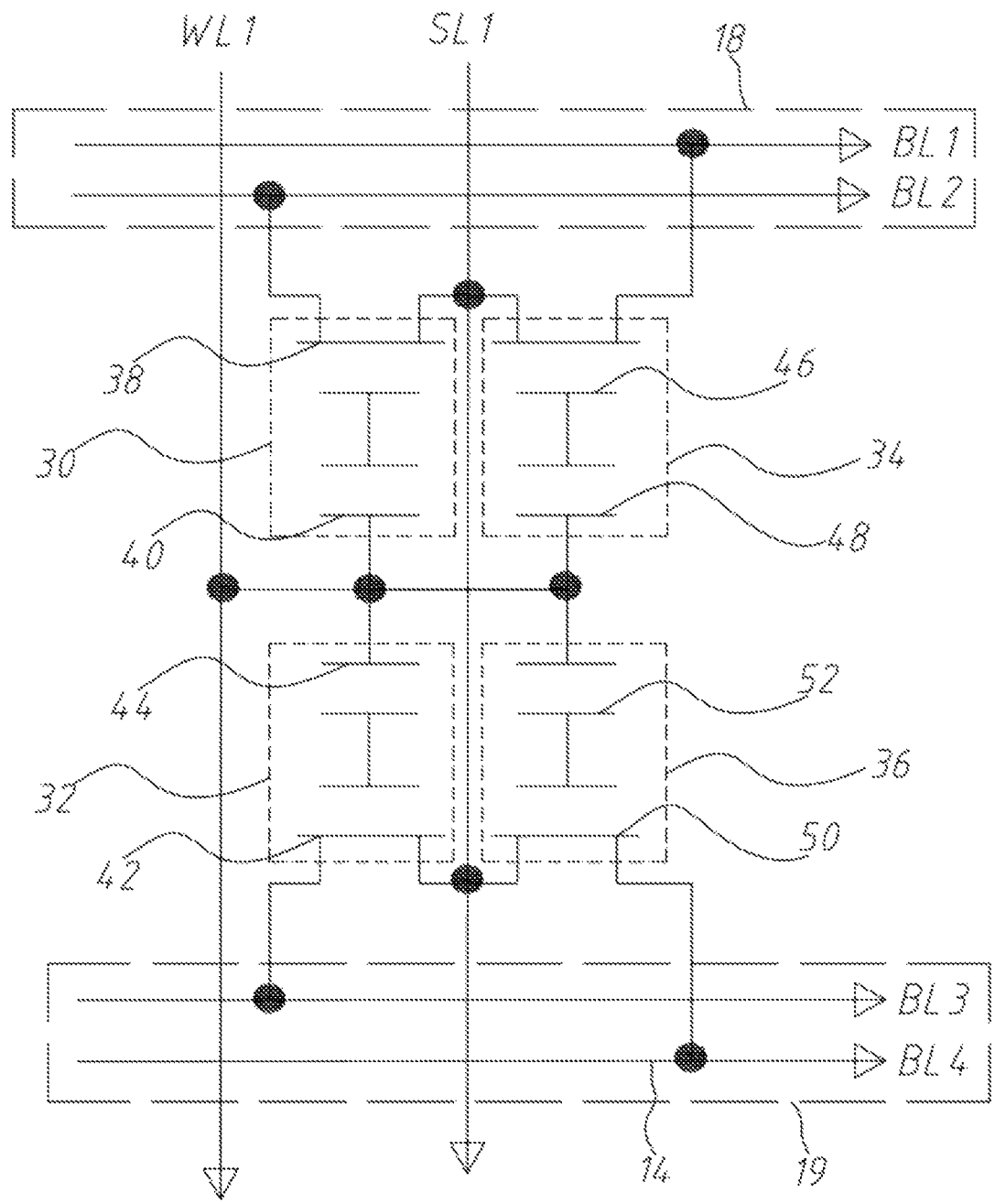
FIG. 6 is a schematic diagram illustrating a circuit of a sub-memory array according to an embodiment of the present invention.

Referring to FIG. 5 and FIG. 6, each sub-memory array 28 includes a first memory cell 30, a second memory cell 32, a third memory cell 34, and a fourth memory cell 36. Each sub-memory array 28 is located between the first group bit line 18 and the second group bit line 19. The first memory cell 30 is connected to the second bit line BL2 of the first group bit line 18, the first common source line SL1, and the first word line WL1. The second memory cell 32 is connected to the third bit line BL3 of the second group bit line 19, the first common source line SL1, and the first word line WL1. The first memory cell 30 and the second memory cell 32 are arranged to be symmetric to each other and located at the same side of the first common source line SL1. The third memory cell 34 is connected to the first bit line BL1 of the first group bit line 18, the first common source line SL1, and the first word line WL1 and arranged to be symmetric to the first memory cell 30 with the first common source line SL1 as an axis. The fourth memory cell 36 is connected to the fourth bit line BL4 of the second group bit line 19, the first common source line SL1, and the first word line WL1 and arranged to be symmetric to the second memory cell 32 with the first common source line SL1 as an axis. The third memory cell 34 and the fourth memory cell 36 are arranged to be symmetric to each other and located at the same side of the first common source line SL1. The first memory cell 30 and the third memory cell 34 are respectively located at two different sides of the first common source line SL1. The second memory cell 32 and the fourth memory cell 36 are respectively located at two different sides of the first common source line SL1.

Since the first memory cell 30, the second memory cell 32, the third memory cell 34, and the fourth memory cell 36 are arranged to be symmetric to each other and connected to the first word line WL1, the first memory cell 30, the second memory cell 32, the third memory cell 34, and the fourth memory cell 36 are connected to the first word line in sharing the same connection point. As illustrated in FIG. 4, in adjacent two of the sub-memory arrays 28, the two third memory cells 34 are adjacent to each other and connected to the same bit line 14 for sharing the same connection point, and the two fourth memory cells 36 are adjacent to each other and connected to the same bit line 14 for sharing the same connection point. This kind of common connection point arrangement is employed to reduce the entire area of layout.

The first memory cell 30 includes a field-effect transistor 38 and a capacitor 40. The field-effect transistor 38 has a drain, a source, and a first conductive gate (the detailed structure described later). The drain of the field-effect transistor 38 is connected to the second bit line BL2 of the first group bit line 18. The source of the field-effect transistor 38 is connected to the first common source line SL1. The voltage Vw of the first word line WL1 is coupled to the field-effect transistor 38 through the capacitor 40 made of the same polysilicon as the first conductive gate of field-effect transistor 38. The field-effect transistor 38 receives the voltage Vs of the first common source line SL1 and the voltage Vb of the second bit line BL2 of the first group bit line 18, such that memory data writing or memory data erasing is performed by controlling the conductive gate of field-effect transistor 38.

The second memory cell 32 includes a field-effect transistor 42 and a capacitor 44. The field-effect transistor 42 has a drain, a source, and a first conductive gate (the detailed structure described later). The drain of the field-effect transistor 42 is connected to the third bit line BL3 of the second group bit line 19. The source of the field-effect transistor 42 is connected to the first common source line SL1. The voltage Vw of the first word line WL1 is coupled to the field-effect transistor 42 through the capacitor 44 made of the same polysilicon as the first conductive gate of the field-effect transistor 42. The field-effect transistor 42 receives the voltage Vs of the first common source line SL1 and the voltage Vb of the third bit line BL3 of the second group bit line 19, such that memory data writing or memory data erasing is performed by controlling the conductive gate of field-effect transistor 42.

The third memory cell 34 includes a field-effect transistor 46 and a capacitor 48. The field-effect transistor 46 has a drain, a source, and a first conductive gate (the detailed structure described later). The drain of the field-effect transistor 46 is connected to the first bit line BL1 of the first group bit line 18. The source of the field-effect transistor 46 is connected to the first common source line SL1, so as to share the same connection point with the first memory cell 30. The voltage Vw of the first word line WL1 is coupled to the field-effect transistor 46 through the capacitor 48 made of the same polysilicon as the first conductive gate of the field-effect transistor 46. The capacitor 48 and the field-effect transistor 46 are respectively arranged to be symmetric to the capacitor 40 and the field-effect transistor 38, with the first common source line SL1 as an axis. The field-effect transistor 46 receives the voltage Vs of the first common source line SL1 and the voltage Vb of the first bit line BL1 of the first group bit line 18, such that memory data writing or memory data erasing is performed by controlling the conductive gate of field-effect transistor 46.

The fourth memory cell 36 includes a field-effect transistor 50 and a capacitor 52. The field-effect transistor 50 has a drain, a source, and a first conductive gate (the detailed structure described later). The drain of the field-effect transistor 50 is connected to the fourth bit line BL4 of the second group bit line 19. The source of the field-effect transistor 50 is connected to the first common source line SL1, so as to share the same connection point with the second memory cell 32. The voltage Vw of the first word line WL1 is coupled to the field-effect transistor 50 through the capacitor 52 made of the same polysilicon as the first conductive gate of the field-effect transistor 50. The capacitor 52 and the field-effect transistor 50 are respectively arranged to be symmetric to the capacitor 40 and the field-effect transistor 42, with the first common source line SL1 as an axis. The capacitor 52 is directly connected to the capacitor 48 and located between the field-effect transistor 50 and the field-effect transistor 46. The field-effect transistor 50 receives the voltage Vs of the first common source line SL1 and the voltage Vb of the fourth bit line BL4 of the second group bit line 19, such that memory data writing or memory data erasing is performed by controlling the conductive gate of field-effect transistor 50.

Since the capacitors 40, 44, 48, and 52 are all connected to the first word line WL1, they may share the same gate connection point 54 on the first word line WL1. In addition, as illustrated in FIG. 4, in two adjacent sub-memory arrays 28, two field-effect transistors 46 are adjacent to each other and are connected to the same bit line 14, so as to share the same drain connection point 56, and two field effect transistors 50 are adjacent to each other and are connected to the same bit line 14, so as to share the same drain connection point 56. As such, in this way of sharing connection point, the area of overall layout can be reduced, hereby reducing the production cost significantly.

Figure 7:
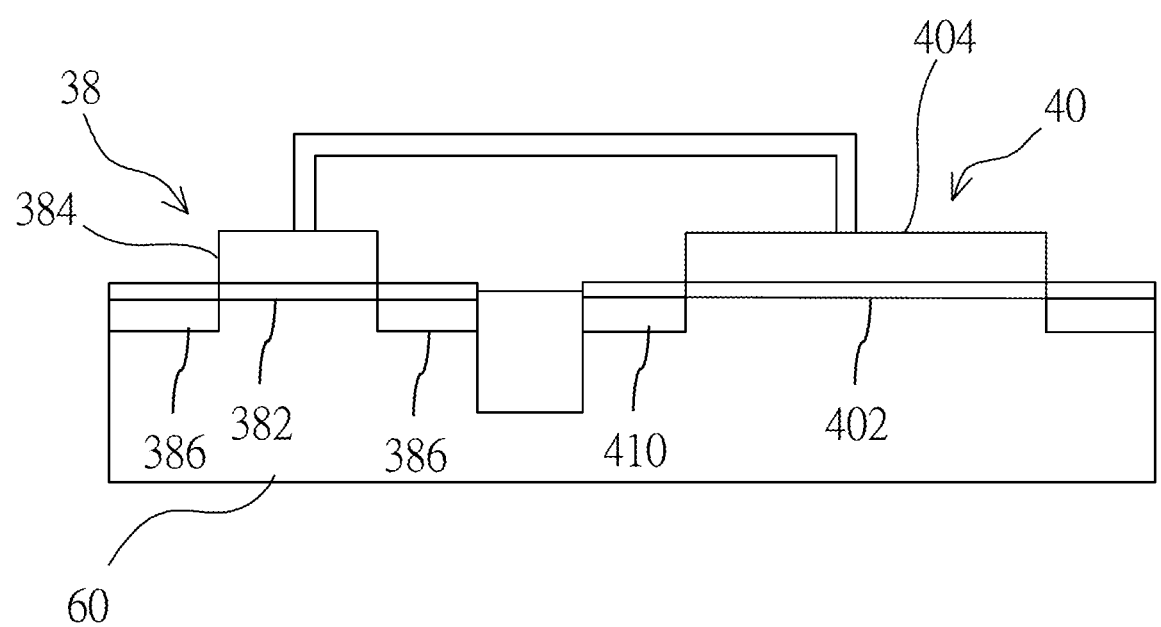
FIG. 7 is a cross-sectional view of a first memory cell according to an embodiment of the present invention.

The detailed structures of the first memory cell 30, the second memory cell 32, the third memory cell 34, and the fourth memory cell 36 are described as follows. Since the cross-sectional structure of each memory cell is the same, only the first memory cell 30 is represented here. As illustrated in FIG. 7, the first memory cell 30 includes the field-effect transistor 38 and the capacitor 40 that are formed in a semiconductor substrate 60. The field-effect transistor 38 includes a first dielectric layer 382, a first conductive gate 384, and two first ion-doped areas 386. The first dielectric layer 382 is formed on the surface of the semiconductor substrate 60. The first conductive gate 384 is stacked on the first dielectric layer 382. The two first ion-doped areas 386 are formed in the semiconductor substrate 60 under regions that are arranged at two sides of the first conductive gate 384. The first ion-doped areas 386 are respectively used as a source and a drain. The capacitor 40 includes a second dielectric layer 402, a second conductive gate 404, and a second ion-doped area 410. The second ion-doped area 410 is formed in the semiconductor substrate 60. The second dielectric layer 402 is formed on the side of the second ion-doped area 410. The second conductive gate 404 is stacked on the second dielectric layer 402. The second dielectric layer 402 and the first conductive gate 384 are made of the same polysilicon layer. Thus, the second conductive gate 404 and the first conductive gate 384, connected to each other, extend from the first dielectric layer 382 to the second dielectric layer 402 to produce a capacitance effect. The first ion-doped area 386 and the second ion-doped area 410 may be doped with the same ions. In addition, the second conductive gate 404 has a shape of multiple fingers. As illustrated in FIG. 5, one side of the first conductive gate 384 extends outward to form the second conductive gate 404 that includes a strip portion 406 and parallel finger portions 408. One end of each of the finger portions 408, connected to the strip portion 406, extends outward from the strip portion 406.

The field-effect transistor 38 may be an N-type field-effect transistor or a P-type field-effect transistor. When the field-effect transistor 38 is an N-type field-effect transistor, the first ion-doped areas 386 and the second ion-doped area 410 are N-type ion-doped areas, and the semiconductor substrate 60 has a P conductivity type or a P-type well. When the field-effect transistor 38 is a P-type field-effect transistor, the first ion-doped areas 386 and the second ion-doped area 410 are P-type ion-doped areas, and the semiconductor substrate 60 has an N conductivity type or an N-type well.

The method for operating a small-area side-capacitor read-only memory array of the present invention changes based on the N-type field-effect transistor or the P-type field-effect transistor. When the field-effect transistors 38, 42, 46, and 50 are N-type field-effect transistors, the first memory cell 30, the second memory cell 32, the third memory cell 34 and the fourth memory cell 36 all function as operation memory cells, and all the operation memory cells are chosen to perform a writing or erasing operation.

In operating all the operation memory cells, a substrate voltage Vsub is applied to the semiconductor substrate 60, which is connected to all the operation memory cells, and a bit voltage Vb, a word voltage Vw and a common source voltage Vs are respectively applied to the bit lines 14, the word lines 20 and the common source lines 24, which are connected to all the operation memory cells. In writing, Vsub is grounded, Vs=Vb=0, and Vw=HV (High Voltage). In erasing, Vsub is grounded, Vs=Vb=HV, and Vw is floating.

Besides, when the field-effect transistors 38, 42, 46, and 50 are P-type field-effect transistors, a substrate voltage Vsub is applied to the semiconductor substrate 60. In writing, Vsub=HV (High Voltage), Vs=Vb=HV, and Vw=0. In erasing, Vsub=HV (High Voltage), Vs=Vb=0, and Vw is floating.

As such, through the ways of voltage applications mentioned above, byte writing and byte erasing of non-volatile memory can be achieved without the need to add any additional isolating transistors.

When the memory cell operates in writing, its voltage is boosted from about 2.5 volts or 3.3 volts to a stable high voltage. However, due to the difference between the drain voltage and the source voltage, the current will be generated between the drain and the source, which will change the high voltage. The larger the current is, the higher the change of the high voltage is, the stronger the required voltage boost is, and the larger the layout area is. When the flash memory-based structure is programmed, the gate capacitor and the drain are biased at high voltage, the source is grounded, and the current between the drain and the source is about 500 μA/bit. In the present invention, when all the memory cells are selected to operate in writing simultaneously, a high voltage is applied to the gate capacitor. When all the memory cells are selected to operate in erasing simultaneously, high voltages are applied to the source and the drain. The voltages of the source and the drain are respectively boosted from about 5 volts and 3.3 volts to about 9 volts and 7 volts. In other words, the voltages of the source and the drain are far below the withstand voltage of the transistor. The method for operating a small-area side-capacitor read-only memory array of the present invention can erase all memory cells at one time and program all memory cells together without load under the applied bias condition, so that the voltage boost can be reduced to improve the efficiency.

In conclusion, the small-area side-capacitor read-only memory device, the memory array and the method for operating the same of the present invention embed the field-effect transistor in the semiconductor substrate. The first conductive gate of the field-effect transistor is stacked on the first dielectric layer. The side of the first conductive gate extends to the top of the second dielectric layer and connects to the second conductive gate to generate a capacitance effect. The second conductive gate has finger portions connected to a strip portion. The finger portions can form the smallest circuit layout area to achieve the highest capacitance value, thereby decreasing the overall area of the read-only memory. The small-area read-only memory can perform writing and erasing operations on all the memory cells at specific bias voltages, so as to program a large number of memory cells.

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:

1. A small-area side-capacitor read-only memory device comprising:
    a semiconductor substrate;
    a field-effect transistor, formed in the semiconductor substrate, comprising a first dielectric layer, a first conductive gate, and first ion-doped areas, wherein the first dielectric layer is formed on a surface of the semiconductor substrate, the first conductive gate is stacked on the first dielectric layer, the first ion-doped areas are formed in the semiconductor substrate under regions that are arranged at two sides of the first conductive gate, and the first ion-doped areas are respectively used as a source and a drain; and
    a capacitor, formed in the semiconductor substrate, comprising a second dielectric layer, a second conductive gate, and a second ion-doped area, wherein the second dielectric layer is formed on a surface of the semiconductor substrate, the second conductive gate is connected to the first conductive gate and stacked on the second dielectric layer, the second ion-doped area and the first ion-doped areas are doped with ions that have a same conductivity type, the second ion-doped area is formed at a side of the second dielectric layer, the second conductive gate has a strip portion and parallel finger portions, and one end of each of the finger portions, connected to the strip portion, extends outward from the strip portion.

2. The small-area side-capacitor read-only memory device for according to claim 1, wherein the effect-field transistor is an N-type transistor, the first ion-doped areas and the second ion-doped area are N-type ion-doped areas, and the semiconductor substrate has a P conductivity type or a P-type well.

3. The small-area side-capacitor read-only memory device according to claim 1, wherein the field-effect transistor is a P-type transistor, the first ion-doped areas and the second ion-doped area are P-type ion-doped areas, and the semiconductor substrate has an N conductivity type or a N-type well.

4. A small-area side-capacitor read-only memory array comprising:
    parallel bit lines classified into a plurality of groups, wherein the plurality groups of the bit lines comprise a first group bit line and a second group bit line;
    parallel word lines, arranged perpendicular to the bit lines, comprising a first word line;
    parallel common source lines, arranged parallel to the word lines, comprising a first common source line; and
    sub-memory arrays, wherein each of the sub-memory arrays, connected to two groups of the bit lines, the word line, and the common source line, comprises:
        a first memory cell connected to the first group bit line, the first common source line, and the first word line;

a second memory cell connected to the second group bit line, the first common source line, and the first word line, wherein the first memory cell and the second memory cell are arranged to be symmetric to each other and located at a same side of the first common source line;

a third memory cell connected to the first group bit line, the first common source line, and the first word line and arranged to be symmetric to the first memory cell with the first common source line as an axis; and a fourth memory cell connected to the second group bit line, the first common source line, and the first word line and arranged to be symmetric to the second memory cell with the first common source line as an axis, wherein the third memory cell and the fourth memory cell are arranged to be symmetric to each other and located at a same side of the first common source line, the first memory cell and the third memory cell are respectively located at two different sides of the first common source line, and each of the first memory cell, the second memory cell, the third memory cell, and the fourth memory cell includes a field-effect transistor and a capacitor that are formed in a semiconductor substrate;

wherein the field-effect transistor comprises a first dielectric layer, a first conductive gate, and first ion-doped areas, the first dielectric layer is formed on a surface of the semiconductor substrate, the first conductive gate is stacked on the first dielectric layer, the first ion-doped areas are formed in the semiconductor substrate under regions that are arranged at two sides of the first conductive gate, and the first ion-doped areas are respectively used as a source and a drain;

wherein the capacitor comprises a second dielectric layer, a second conductive gate, and a second ion-doped area, the second dielectric layer is formed on a surface of the semiconductor substrate, the second conductive gate is connected to the first conductive gate and stacked on the second dielectric layer, the second ion-doped area and the first ion-doped areas are doped with ions that have a same conductivity type, the second ion-doped area is formed at a side of the second dielectric layer, the second conductive gate has a strip portion and parallel finger portions, and one end of each of the finger portions, connected to the strip portion, extends outward from the strip portion.

5. The small-area side-capacitor read-only memory array according to claim 4, wherein each of the sub-memory arrays is located between two adjacent groups of the bit lines.

6. The small-area side-capacitor read-only memory array according to claim 4, wherein the first memory cell, the second memory cell, the third memory cell, and the fourth memory cell are connected to the first word line in sharing a same connection point.

7. The small-area side-capacitor read-only memory array according to claim 4, wherein the first group bit line, comprising two of the bit lines, is respectively connected to the first memory cell and the third memory cell; and the second group bit line, comprises two of the bit lines, is respectively connected to the second memory cell and the fourth memory cell.

8. The small-area side-capacitor read-only memory array according to claim 7, wherein in adjacent two of the sub-memory arrays, the two third memory cells are adjacent to each other and connected to the same bit line for sharing a same connection point, and the two fourth memory cells are adjacent to each other and connected to the same bit line for sharing a same connection point.

9. The small-area side-capacitor read-only memory array according to claim 4, wherein the effect-field transistor is an N-type transistor, the first ion-doped areas and the second ion-doped area are N-type ion-doped areas, and the semiconductor substrate has a P conductivity type or a P-type well.

10. The small-area side-capacitor read-only memory array according to claim 4, wherein the effect-field transistor is a P-type transistor, the first ion-doped areas and the second ion-doped area are P-type ion-doped areas, and the semiconductor substrate has an N conductivity type or an N-type well.

11. A method for operating a small-area side-capacitor read-only memory array, wherein the small-area side-capacitor read-only memory array comprises parallel bit lines classified into a plurality of groups, wherein the plurality groups of the bit lines comprise a first group bit line and a second group bit line; parallel word lines, arranged perpendicular to the bit lines, comprising a first word line; parallel common source lines, arranged parallel to the word lines, comprising a first common source line; and sub-memory arrays, wherein each of the sub-memory arrays, connected to two groups of the bit lines, the word line, and the common source line, comprises: a first memory cell connected to the first group bit line, the first common source line, and the first word line; a second memory cell connected to the second group bit line, the first common source line, and the first word line, wherein the first memory cell and the second memory cell are arranged to be symmetric to each other and located at a same side of the first common source line; a third memory cell connected to the first group bit line, the first common source line, and the first word line and arranged to be symmetric to the first memory cell with the first common source line as an axis; and a fourth memory cell connected to the second group bit line, the first common source line, and the first word line and arranged to be symmetric to the second memory cell with the first common source line as an axis, wherein the third memory cell and the fourth memory cell are arranged to be symmetric to each other and located at a same side of the first common source line, the first memory cell and the third memory cell are respectively located at two different sides of the first common source line, and each of the first memory cell, the second memory cell, the third memory cell, and the fourth memory cell comprises an N-type field-effect transistor and a capacitor that are formed in a semiconductor substrate;

wherein the N-type field-effect transistor comprises a first dielectric layer, a first conductive gate, and first ion-doped areas, the first dielectric layer is formed on a surface of the semiconductor substrate, the first conductive gate is stacked on the first dielectric layer, the first ion-doped areas are formed in the semiconductor substrate under regions that are arranged at two sides of the first conductive gate, and the first ion-doped areas are respectively used as a source and a drain;

wherein the capacitor comprises a second dielectric layer, a second conductive gate, and a second ion-doped area, the second dielectric layer is formed on a surface of the semiconductor substrate, the second conductive gate is connected to the first conductive gate and stacked on the second dielectric layer, the second ion-doped area and the first ion-doped areas are doped with ions that have a same conductivity type, the second ion-doped area is formed at a side of the second dielectric layer, the second conductive gate has a strip portion and parallel finger portions, and one end of each of the finger portions, connected to the strip portion, extends outward from the strip portion;

wherein the first memory cell, the second memory cell, the third memory cell and the fourth memory cell all function as operation memory cells, and in operating all the operation memory cells, the method is characterized in that a substrate voltage Vsub is applied to the semiconductor substrate, which is connected to all the operation memory cells, that a bit voltage Vb, a word voltage Vw and a common source voltage Vs are respectively applied to the bit lines, the word lines and the common source lines, which are connected to all the operation memory cells, that in writing, following conditions are satisfied:

Vsub is grounded;
Vs=Vb=0; and
Vw=HV (High Voltage); and that in erasing, following conditions are satisfied:

Vsub is grounded;
Vs=Vb=HV; and
Vw is floating.

12. The method for operating a small-area side-capacitor read-only memory array according to claim 11, wherein each of the sub-memory arrays is located between two adjacent groups of the bit lines.

13. The method for operating a small-area side-capacitor read-only memory array according to claim 11, wherein the first memory cell, the second memory cell, the third memory cell, and the fourth memory cell are connected to the first word line in sharing a same connection point.

14. The method for operating a small-area side-capacitor read-only memory array according to claim 11, wherein the first group bit line, comprising two of the bit lines, is respectively connected to the first memory cell and the third memory cell; and the second group bit line, comprises two of the bit lines, is respectively connected to the second memory cell and the fourth memory cell.

15. The method for operating a small-area side-capacitor read-only memory array according to claim 14, wherein in adjacent two of the sub-memory arrays, the two third memory cells are adjacent to each other and connected to the same bit line for sharing a same connection point, and the two fourth memory cells are adjacent to each other and connected to the same bit line for sharing a same connection point.

16. A method for operating a small-area side-capacitor read-only memory array, wherein the small-area side-capacitor read-only memory array comprises parallel bit lines classified into a plurality of groups, wherein the plurality groups of the bit lines comprise a first group bit line and a second group bit line; parallel word lines, arranged perpendicular to the bit lines, comprising a first word line; parallel common source lines, arranged parallel to the word lines, comprising a first common source line; and sub-memory arrays, wherein each of the sub-memory arrays, connected to two groups of the bit lines, the word line, and the common source line, comprises: a first memory cell connected to the first group bit line, the first common source line, and the first word line; a second memory cell connected to the second group bit line, the first common source line, and the first word line, wherein the first memory cell and the second memory cell are arranged to be symmetric to each other and located at a same side of the first common source line; a third memory cell connected to the first group bit line, the first common source line, and the first word line and arranged to be symmetric to the first memory cell with the first common source line as an axis; and a fourth memory cell connected to the second group bit line, the first common source line, and the first word line and arranged to be symmetric to the second memory cell with the first common source line as an axis, wherein the third memory cell and the fourth memory cell are arranged to be symmetric to each other and located at a same side of the first common source line, the first memory cell and the third memory cell are respectively located at two different sides of the first common source line, and each of the first memory cell, the second memory cell, the third memory cell, and the fourth memory cell comprises a P-type field-effect transistor and a capacitor that are formed in a semiconductor substrate;

wherein the P-type field-effect transistor comprises a first dielectric layer, a first conductive gate, and first ion-doped areas, the first dielectric layer is formed on a surface of the semiconductor substrate, the first conductive gate is stacked on the first dielectric layer, the first ion-doped areas are formed in the semiconductor substrate under regions that are arranged at two sides of the first conductive gate, and the first ion-doped areas are respectively used as a source and a drain;

wherein the capacitor comprises a second dielectric layer, a second conductive gate, and a second ion-doped area, the second dielectric layer is formed on a surface of the semiconductor substrate, the second conductive gate is connected to the first conductive gate and stacked on the second dielectric layer, the second ion-doped area and the first ion-doped areas are doped with ions that have a same conductivity type, the second ion-doped area is formed at a side of the second dielectric layer, the second conductive gate has a strip portion and parallel finger portions, and one end of each of the finger portions, connected to the strip portion, extends outward from the strip portion;

wherein the first memory cell, the second memory cell, the third memory cell and the fourth memory cell all function as operation memory cells, and in operating all the operation memory cells, the method is characterized in that a substrate voltage Vsub is applied to the semiconductor substrate, which is connected to all the operation memory cells, that a bit voltage Vb, a word voltage Vw and a common source voltage Vs are respectively applied to the bit lines, the word lines and the common source lines, which are connected to all the operation memory cells, that in writing, following conditions are satisfied:

Vsub=HV (High Voltage);
Vs=Vb=HV; and
Vw=0; and that in erasing, following conditions are satisfied:

Vsub=HV (High Voltage);
Vs=Vb=0; and
Vw is floating.

17. The method for operating a small-area side-capacitor read-only memory array according to claim 16, wherein each of the sub-memory arrays is located between two adjacent groups of the bit lines.

18. The method for operating a small-area side-capacitor read-only memory array according to claim 16, wherein the first memory cell, the second memory cell, the third memory cell, and the fourth memory cell are connected to the first word line in sharing a same connection point.

19. The method for operating a small-area side-capacitor read-only memory array according to claim 16, wherein the first group bit line, comprising two of the bit lines, is respectively connected to the first memory cell and the third memory cell; and the second group bit line, comprises two of the bit lines, is respectively connected to the second memory cell and the fourth memory cell.

20. The method for operating a small-area side-capacitor read-only memory array according to claim 19, wherein in adjacent two of the sub-memory arrays, the two third memory cells are adjacent to each other and connected to the same bit line for sharing a same connection point, and the two fourth memory cells are adjacent to each other and connected to the same bit line for sharing a same connection point.

* * * * *